United States Patent
Kim et al.

(10) Patent No.: US 8,113,648 B2
(45) Date of Patent: Feb. 14, 2012

(54) METHOD FOR HIGH RESOLUTION INK-JET PRINT USING PRE-PATTERNED SUBSTRATE AND CONDUCTIVE SUBSTRATE MANUFACTURED USING THE SAME

(75) Inventors: Tae-Su Kim, Daejeon (KR); Jae-Jin Kim, Seoul (KR); Bu-Gon Shin, Daejeon (KR); Duk-Sik Ha, Daejeon (KR); Jung-Ho Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 376 days.

(21) Appl. No.: 12/312,858

(22) PCT Filed: Dec. 5, 2007

(86) PCT No.: PCT/KR2007/006275
§ 371 (c)(1),
(2), (4) Date: May 29, 2009

(87) PCT Pub. No.: WO2008/069565
PCT Pub. Date: Jun. 12, 2008

(65) Prior Publication Data
US 2010/0055396 A1    Mar. 4, 2010

(30) Foreign Application Priority Data

Dec. 5, 2006  (KR) .......................... 10-2006-0122217

(51) Int. Cl.
*B05D 1/26*  (2006.01)
*B05D 3/00*  (2006.01)

(52) U.S. Cl. ........ 347/107; 347/106; 427/286; 427/466; 427/467; 438/584

(58) Field of Classification Search .................. 347/106, 347/107; 427/286, 466, 467; 438/584
See application file for complete search history.

(56) References Cited

U.S. PATENT DOCUMENTS
6,339,461 B1    1/2002 Kashiwazaki et al.
(Continued)

FOREIGN PATENT DOCUMENTS
EP    01515164 A1    3/2005
(Continued)

OTHER PUBLICATIONS
Sirringhaus et al. Science 290, 2000, 2123-2126.*
(Continued)

*Primary Examiner* — David W Wu
*Assistant Examiner* — Vu A Nguyen
(74) *Attorney, Agent, or Firm* — McKenna Long & Aldridge LLP (57) ABSTRACT

A method for high resolution ink-jet print using a pre-patterned substrate employs an ink-jet printing device including an ink-jet head for discharging conductive ink droplets and a driving stage for supporting a substrate to which the conductive ink droplets are hit, to draw a fine line width pattern on the substrate. The method includes (A) forming a stripe pattern with repeated stripes on a substrate surface on which a fine line width pattern will be formed, thereby preparing a pre-patterned substrate; (B) loading the substrate to the ink-jet printing device; and (C) injecting conductive ink droplets to a substrate region where the stripe pattern is formed. An equivalent interval (d) of the stripe pattern and a fine line width (D) of the drawn fine line width pattern satisfy a relation of d<<D, and the hit ink droplets are flowed in an anisotropic form within the region.

9 Claims, 9 Drawing Sheets

U.S. PATENT DOCUMENTS

| | | | |
|---|---|---|---|
| 6,364,450 | B1 | 4/2002 | Yamaguchi et al. |
| 6,870,584 | B2 | 3/2005 | Kawase et al. |
| 2007/0194449 | A1 | 8/2007 | Hirai |

FOREIGN PATENT DOCUMENTS

| | | |
|---|---|---|
| JP | 2006-313916 | 11/2006 |

OTHER PUBLICATIONS

Kagan et al. Applied Physics Letters 79(21), Nov. 2001, 3536-3538.*
Street et al. Materialstoday 9(4), Apr. 2006, 32-37.*

* cited by examiner

METHOD FOR HIGH RESOLUTION INK-JET PRINT USING PRE-PATTERNED SUBSTRATE AND CONDUCTIVE SUBSTRATE MANUFACTURED USING THE SAME

This application is a national phase application of PCT/KR2007/006275 filed on Dec. 5, 2007 along with Korean Patent Application No. 10-2006-0122217 filed on Dec. 5, 2007 both of which contents are hereby incorporated by reference in their entirety.

TECHNICAL FIELD

The present invention relates to a method for high resolution ink-jet print using a pre-patterned substrate and a conductive substrate manufactured using the method, and more particularly to a method for high resolution ink-jet print using a pre-patterned substrate, which may realize a high resolution pattern while printing an ink-jet pattern of an electrode or a color filter, and a conductive substrate manufactured using the method.

BACKGROUND ART

A display industry generally includes not only process industries of display modules such as LCD, PDP and OLED but also their forward industries such as TV, notebook, PC monitor, PDA and cellular phone and their backward industries such as component materials and manufacture equipment.

A display module has a device configuration composed of a panel, a black matrix, and a color filter. A white surface light input from a backlight unit passes through pixels. The panel controls the white surface light according to a signal voltage of individual pixels input from a driving circuit unit to realize a color image. In addition, the black matrix is formed among pixels of the color filter to isolate lights emitted from pixels such that the lights do not interfere with each other. Also, the black matrix absorbs light input from outside such that the light is not reflected. The color filter is a resin film including dyes or pigments of three basic colors (R, G, B) such that a light passing through a liquid crystal has a color.

In recent, cost reduction is coming into an essential issue in the electronic industry fields and flat plate display fields including LCD, and the ink-jet printing technology is applied in pattern formation of the color filter for the cost reduction. That is to say, the ink jet printing technology allowing simplification of a production procedure and design of a large-sized product substitutes for existing technologies in aspect of cost reduction so as to manufacture a pattern of color filter in an easy and cheap way, and its application is more expanded from the display field.

Generally, the ink-jet printing is a non-contact patterning technique that injects solution or suspension into droplets of several to several ten pl (Pico Liter) through fine nozzles, and it allows printing into a resolution of several ten micrometers.

This ink-jet printing technology is applied in various ways from the display field such as PDP, LCD and OLED to flexible electronic devices and semiconductor circuits including E-Pper or RFID in addition to color filter and electrode formation.

Compared with photolithography or screen printing, the ink-jet printing technology requires no mask for fine line forming, is not affected by a size of substrate to be printed, and ensures short printing time and simple printing process.

Figure 1:
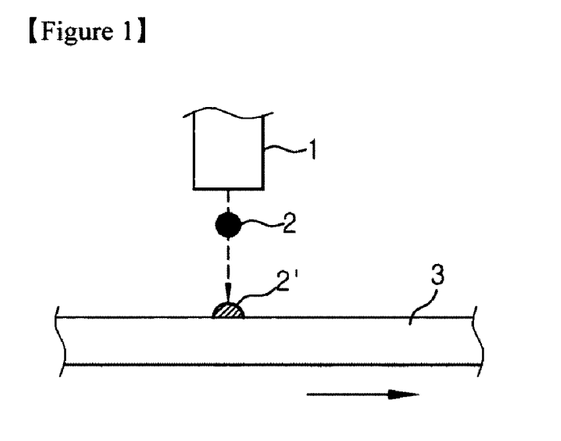
FIG. 1 is a diagram illustrating a conventional ink-jet printing method.

In a conventional printing method for making a color filter, as shown in FIG. 1, ink droplets 2 subsequently discharged from an ink-jet head 1 are hit to a light transmitting region on a transparent substrate 3, and the hit ink droplets, namely a resin composition 2' is dried to form a pixel pattern.

However, in the conventional printing method, the ink droplets discharged from the ink-jet head and hit to the substrate is spread with isotropy due to a flat surface of the substrate when being surface-contacted with the substrate, so there is a limit in realizing high resolution in lines with fine line widths for enhancing resolution. That is to say, when being hit, the ink droplets may be printed over the line width, which makes the ink droplets blurred.

Meanwhile, for printing a high resolution pattern, it is possible to improve characteristics of ink droplets, but it requires considering complicated factors including dispersion and dynamic viscosity of ink and roughness of a substrate.

That is to say, for ensuring dispersion of ink, there should be considered particle size of coating material, characteristics of additives such as solvent and dispersing agent, and ink characteristics such as ink viscosity and surface tension. Also, after discharging ink, length of ligament like a tail and discharging frequency should be considered, and wettability of ink should also be considered. Thus, there are needed much time and endeavor for pattern printing of high resolution.

DISCLOSURE

Technical Problem

The present invention is designed to solve the problems of the prior art, and therefore it is an object of the present invention to provide a method for high resolution ink-jet print using a pre-patterned substrate, which allows ink-jet printing of a fine width pattern with high resolution regardless of characteristics of ink and substrate, and a conductive substrate manufactured using the method.

Technical Solution

In order to accomplish the above object, the present invention provides a method for high resolution ink jet print using a pre-patterned substrate, which uses an ink-jet printing device including an ink-jet head for discharging conductive ink droplets and a driving stage for supporting a substrate to which the conductive ink droplets are hit, so as to draw a fine line width pattern on the substrate, the method including (A) forming a stripe pattern with repeated stripes on a surface of a substrate on which a fine line width pattern is to be formed, thereby preparing a pre-patterned substrate; (B) loading the substrate to the ink-jet printing device; and (C) injecting conductive ink droplets to a region of the substrate where the stripe pattern is formed, wherein an equivalent interval (d) of the stripe pattern and a fine line width (D) of the drawn fine line width pattern satisfy a relation of d<<D, and the conductive ink droplets hit to the substrate are flowed in an anisotropic form within the region where the stripe pattern is formed.

In the present invention, the stripe pattern forming step (A) may include (A1) forming an anti-reflective layer on the substrate; (A2) forming a photoresist layer on the anti-reflective layer; (A3) conducting a laser interference lithography process to the photoresist layer such that the photoresist layer has a photoresist pattern with repeated stripes, which periodically exposes the anti-reflective layer; and (A4) developing and etching the substrate on which the photoresist pattern is formed, thereby forming a stripe pattern on the substrate.

Preferably, the stripe pattern has a positive or negative type, and the stripe pattern has a prominent and depressed shape having valleys and ridges.

According to the present invention, the conductive ink droplets are preferably flowed in an anisotropic form along the valleys, and the conductive ink droplets are preferably not dispersed over the ridges.

Preferably, the stripe pattern is formed using an imprinting or roll printing process.

In another aspect of the present invention, there is also provided a conductive substrate on which a fine line width pattern is drawn, the conductive substrate including a substrate having a stripe pattern with repeated stripes; and conductive ink droplets flowed in an anisotropic form within a region where the stripe pattern is formed so as to form a fine line width pattern, wherein an equivalent interval (d) of the stripe pattern and a fine width (D) of the fine line width pattern satisfy a relation of d<<D.

Preferably, the stripe pattern is formed using a lithography, imprinting or roll printing process, and the lithography process is preferably a laser interference lithography process.

According to the present invention, the fine line width pattern is preferably a color filter pattern or an electrode wiring pattern.

REFERENCE NUMERALS OF ESSENTIAL PARTS IN THE DRAWINGS

100: substrate
110: anti-reflective layer
120: photoresist layer
100': pre-patterned substrate
121, 121': valley
122, 122': ridge
200: laser interference lithography device
300: ink-jet head
400: ink droplet
400: hit ink droplet

BEST MODE

Hereinafter, preferred embodiments of the present invention will be described in detail with reference to the accompanying drawings.

A pre-patterned substrate of the present invention may be manufactured using any one of lithography, imprinting, and roll printing process, but a laser interference lithography process is employed in the present invention.

The laser interference lithography allows forming a photoresist pattern without using a mask. If two laser beams are irradiated from different positions without a mask, a photoresist becomes photosensitive in a region where laser waves are overlapped due to the interference, which is a feature of laser source. After that, if the photoresist layer is developed, a photoresist pattern in which stripe-type openings are regularly repeated is formed.

The high resolution ink jet printing according to the present invention may be classified into a process of preparing a pre-patterned substrate and a process of drawing a fine line width pattern on the pre-patterned substrate. First, the process of preparing a pre-patterned substrate will be explained with reference to FIGS. 2 to 6.

Figure 2:
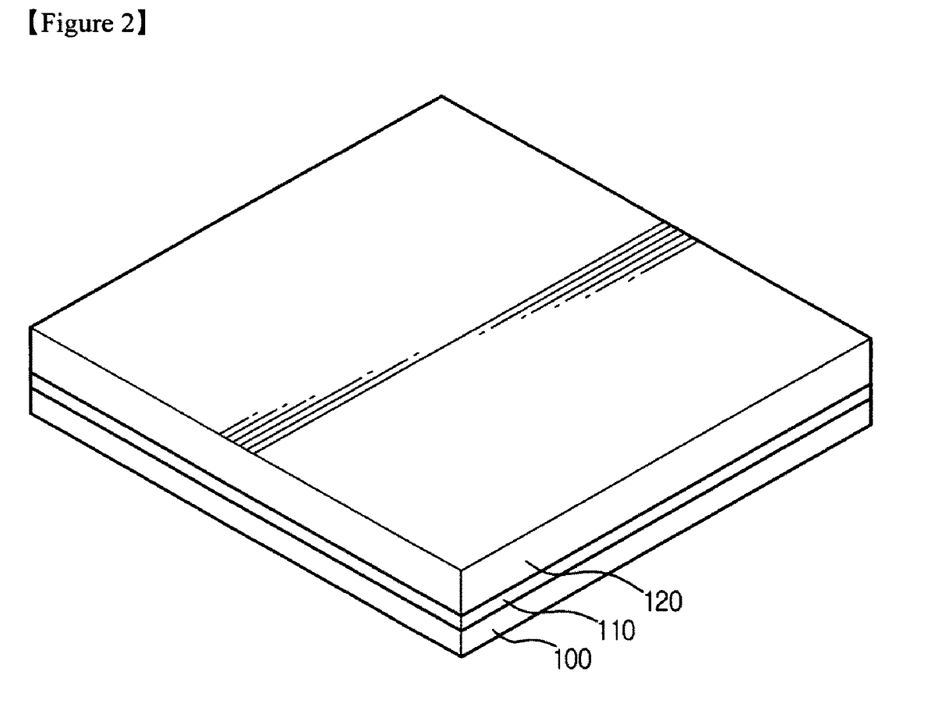
FIG. 2 is a perspective view showing a substrate before forming a stripe pattern according to a preferred embodiment of the present invention.

As shown in FIG. 2, an anti-reflective layer 110 having a fine film shape is formed on a substrate 100, and spin coating is conducted on the anti-reflective layer 110 to form a photoresist layer 120.

In this embodiment, the substrate 100 may be a transparent film made of glass or other various materials. The anti-reflective layer 110 is an anti-reflective coating coated on a surface of the substrate 100 to prevent reflection of incident light and increase transmitting photons. The anti-reflective layer 110 is preferably made of a transparent material such as an oxide film, but not limitedly. For example, in case the substrate is not a color filter or an electrode wiring substrate that requires transparency for use in a display module, the anti-reflective layer may be made of opaque material.

In addition, the photoresist layer 120 preferably adopts a photoresist of I-Line (365 nm) series in consideration of a desired prominent and depressed shape and aspect ratio.

Figure 3:
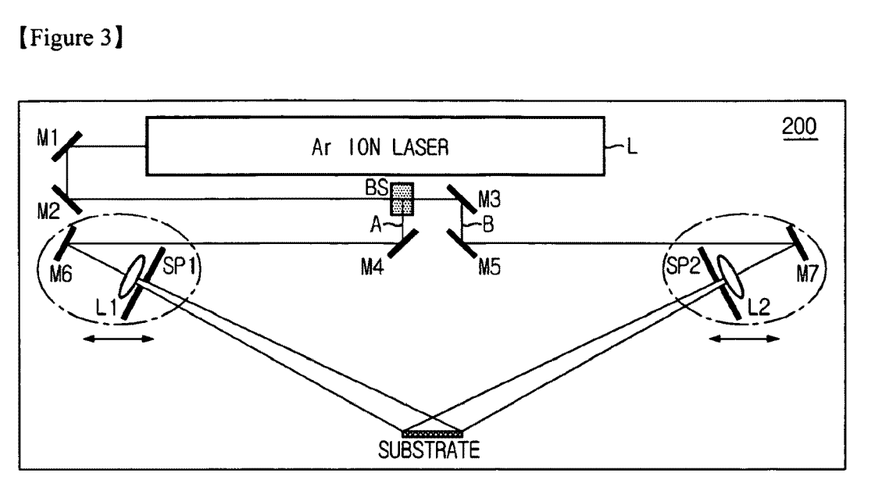
FIG. 3 is a diagram showing an Ar (351 nm) laser interference lithography device used in the stripe pattern forming method according to a preferred embodiment of the present invention.

Then, a stripe pattern is formed on the substrate by means of the laser interference lithography process using a laser interference lithography device 200. As shown in FIG. 3, the laser beam emitted from a laser generator L changes its path while passing through mirror plane optical systems M1, M2, and then it is input to a beam splitter BS.

The laser beam input to the beam splitter BS is separated into a first laser beam A and a second laser beam B for forming an interference pattern. The first laser beam A expands its beam width while passing a first object lens L1 via mirror plane optical systems M4, M6, and noise of the first laser beam A is removed while the first laser beam A passes through a first pinhole SP1 positioned on a focus surface of the first object lens L1.

Similarly, the second laser beam B also expands its beam width and removes noise while passing through mirror plane optical systems M3, M5, M7, a second object lens L2 and a second pinhole SP2. The noise-free first and second laser beams A, B are irradiated together at a predetermined angle to a surface of a substrate S on which the photoresist layer 120 is formed. The first and second laser beams A, B having passed through the first and second pinholes SP1, SP2 have energy distribution substantially similar to a theoretic Gaussian distribution, so two laser beams A, B irradiated to the substrate S form a regular interference pattern.

Thus, the photoresist layer 120 on the substrate S becomes photosensitive according to the regular interference pattern. Also, if the photosensitive photoresist layer 120 is developed, a photoresist pattern in which stripe-type openings are regularly formed to periodically expose the anti-reflective layer 110 is obtained.

At this time, when exposing the photoresist layer 120, Ar ion laser of 351 nm is preferably used, but not limitedly.

Figure 4:
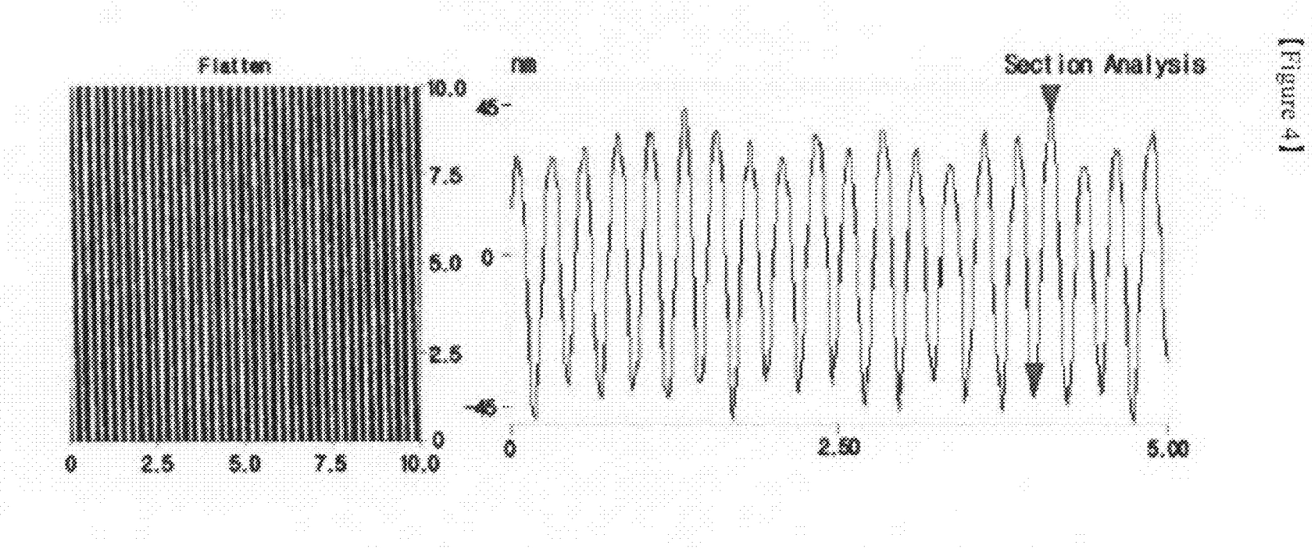
FIG. 4 is a graph showing a measurement result of a stripe pattern, exposed and developed using a laser interference lithography process, measured by AFM (Atomic Force Microscopy), according to a preferred embodiment of the present invention.

FIG. 4 shows a measurement result of a photoresist pattern, exposed and developed through the laser interference lithography process, measured using AFM (Atomic Force Microscopy). A left photograph in FIG. 4 shows a photoresist pattern taken from above, in which a black stripe indicates a stripe-type opening, while a white stripe indicates a photoresist layer positioned between openings. In addition, a right graph in FIG. 4 quantitatively shows an AFM measurement result. Referring to FIG. 4, it would be understood that fine patterns might be formed with uniform depth and pitch when photoresist is patterned using the laser interference lithography process.

The laser interference lithography technology explained above may theoretically form a regular pattern with high resolution since it allows patterning up to ½ of a laser wavelength. However, if the wavelength of laser is decreased to enhance resolution of the pattern, the beam reflected from a target causes multi interference effect, which may deteriorate resolution of the pattern. Thus, for forming a high resolution pattern, it is desirable to fix the phase of laser beam and make a coating on the target for preventing reflection of the beam such that the multi interference effect is reduced.

Figure 5:
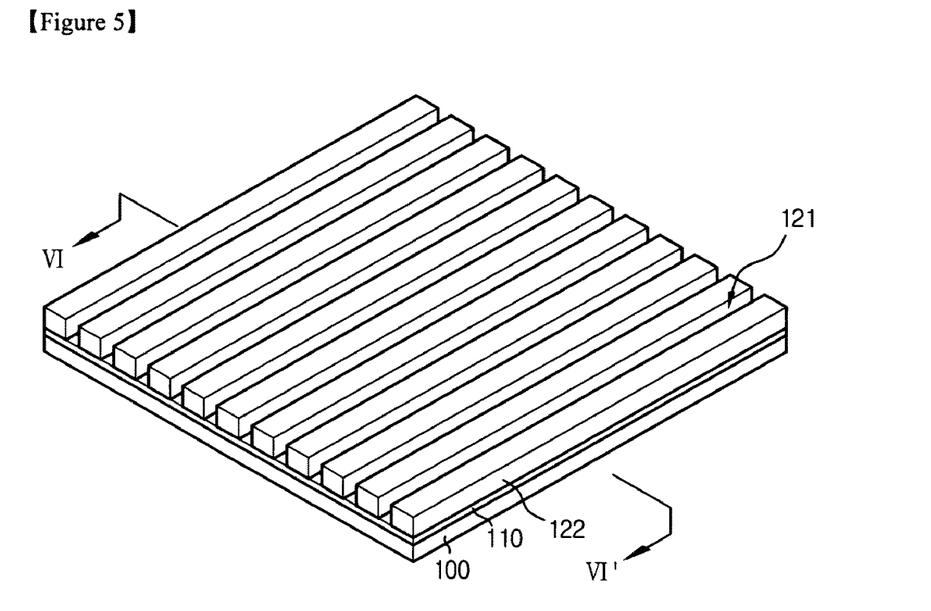
FIG. 5 is a perspective view showing a pre-patterned substrate according to a preferred embodiment of the present invention.
Figure 6:
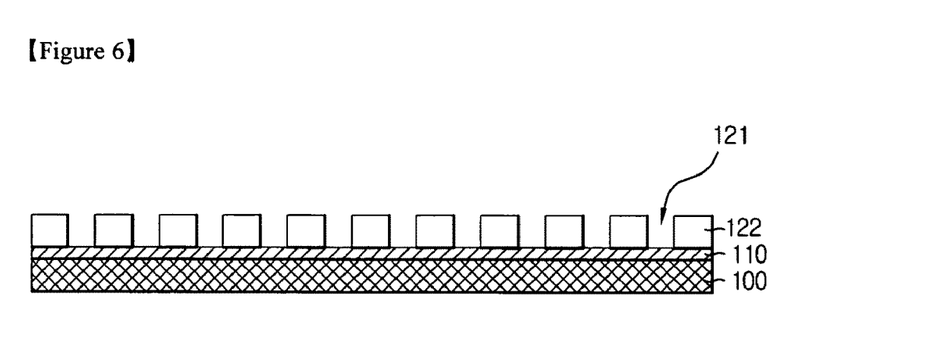
FIG. 6 is a sectional view taken along the line VI-VI' of FIG. 5.

Meanwhile, in this embodiment, the photoresist pattern obtained by the laser interference lithography process is defined as a stripe pattern, which has a prominent and depressed structure with valleys 121 and ridges 122, as shown in FIGS. 5 and 6.

As an alternative, the stripe pattern may be configured such that the valleys 121 and the ridges 122 are symmetric to each other according to regions removed during etching and developing of the photoresist layer 120. That is to say, the stripe pattern may be configured in a positive or negative type.

As another alternative, it is also possible to form a stripe pattern in a way of spin-coating a photoresist layer 120 directly on the substrate 100 without coating an anti-reflective layer 110 thereon, and then conducting the laser interference lithography, developing and etching processes to the substrate 100 on which the photoresist layer 120 is formed.

After preparing a pre-patterned substrate having a stripe pattern with repeated stripes on its surface by means of the laser interference lithography process as mentioned above, the pre-patterned substrate is manufactured into a conductive substrate by means of an ink jet printing device including an ink-jet head and a driving stage. Now, the process of drawing a fine line width pattern will be explained with reference to FIG. 7.

Figure 7:
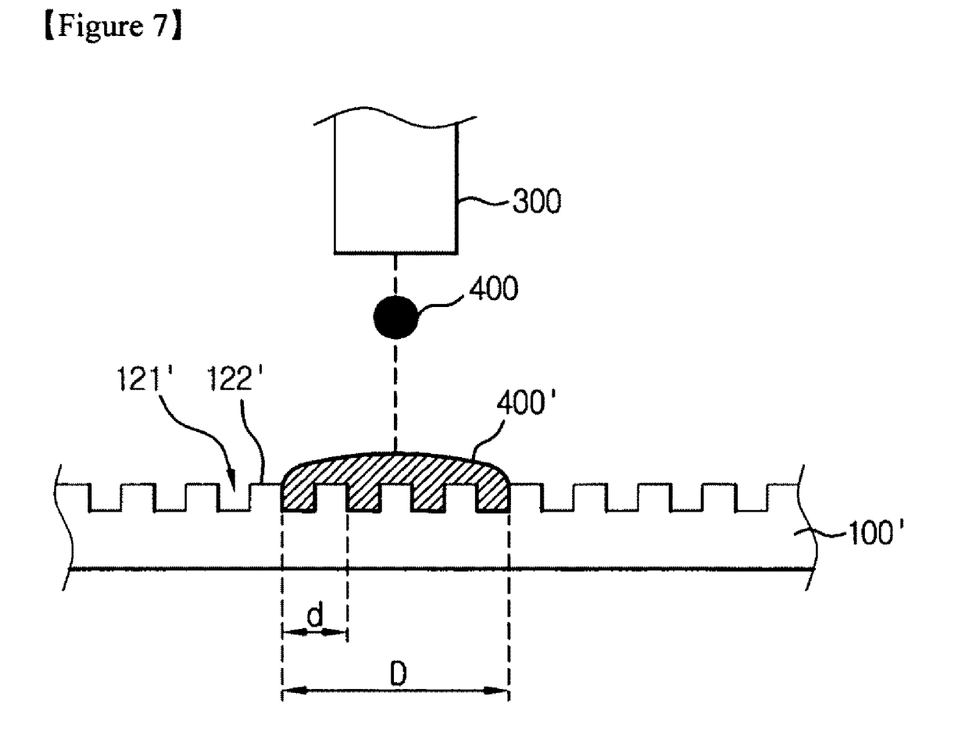
FIG. 7 is a diagram illustrating a method for high resolution ink jet printing using a pre-patterned substrate according to a preferred embodiment of the present invention.

Referring to FIG. 7, a pre-patterned substrate 100' is fixed on a driving stage (not shown) arranged to face an ink-jet head 300.

Then, the ink-jet head 300 injects conductive ink droplets 400 toward the stripe pattern of the pre-patterned substrate 100' to draw a fine line width pattern. At this time, the conductive ink droplets 400 successively discharged from the ink-jet head 300 are composed of metal nano particles and additives, and have predetermined viscosity and surface tension.

In this embodiment, the conductive ink droplets 400 are successively hit to a region of the fine line width pattern to form a hit group, and the hit group allows drawing a fine line width pattern. The conductive ink droplets 400' hit to the region of the fine line width pattern are flowed in an anisotropic form along the valleys 121' formed in the stripe pattern in a length direction together with being hit thereto, but the hit conductive ink droplets 400' do not exceed partition lines of the fine line width pattern due to the ridges 122' formed in the stripe pattern.

That is to say, due to the capillary phenomenon by the ridge 122' positioned at a border of a fine line width D, the hit conductive ink droplets 400' are not dispersed over the border, and the hit conductive ink droplets 400' flow along a plurality of valleys 121' formed in the hit region.

At this time, the valleys 121' and the ridges 122' are arranged at regular intervals d in the region where the fine line width pattern is formed, and the regular interval d and the fine line width D drawn by the hit conductive ink droplets 400' satisfy the following relation: $d \ll D$.

Meanwhile, the valleys 121' and the ridges 122' forming the stripe pattern are preferably formed over a range at least wider than the fine line width pattern.

High resolution ink-jet printing may be realized using the process of preparing a pre-patterned substrate and the process of drawing a fine line width pattern on the pre-patterned substrate, explained above. Now, the conductive substrate manufactured according to the present invention will be compared with a conventional conductive substrate with reference to FIGS. 8 to 11.

Figure 8:
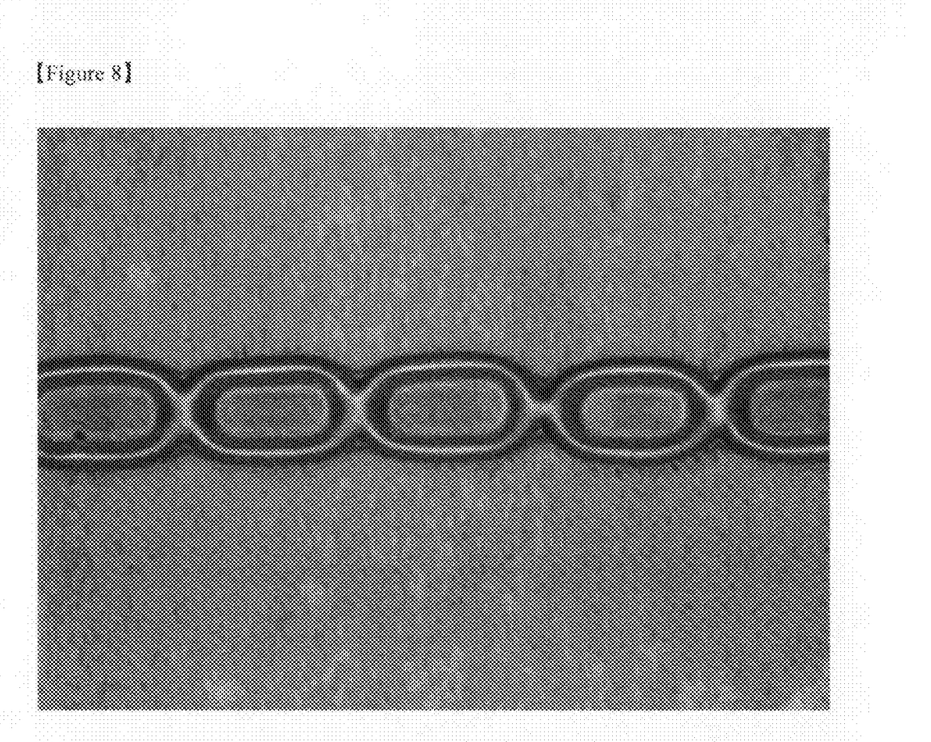
FIGS. 8 and 9 are diagrams showing fine line width patterns, drawn according to the high resolution ink jet printing method according to a preferred embodiment of the present invention.
Figure 9:
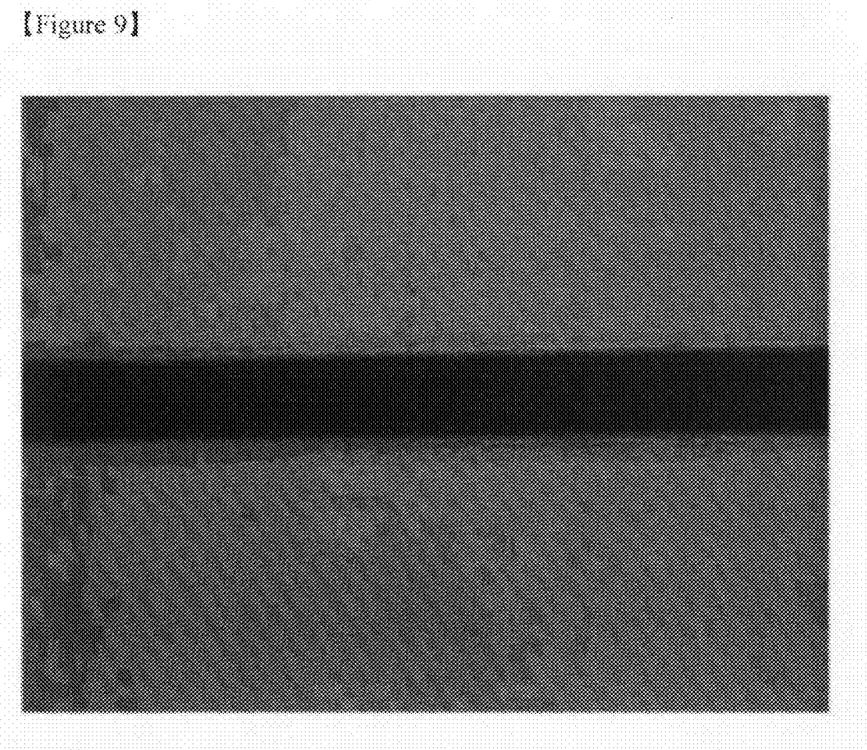

First, a conductive substrate manufactured according to the present invention is explained with reference to FIGS. 8 and 9. As shown in FIG. 8, when ink droplets successively discharged from the ink-jet head are hit to a region of a fine line width pattern, the hit ink droplets are flowed in an anisotropic form by the stripe pattern formed in the region. Thus, it would be found that an ink hit group is drawn in a predetermined pattern along a border of the region, as shown in FIG. 9.

Figure 10:
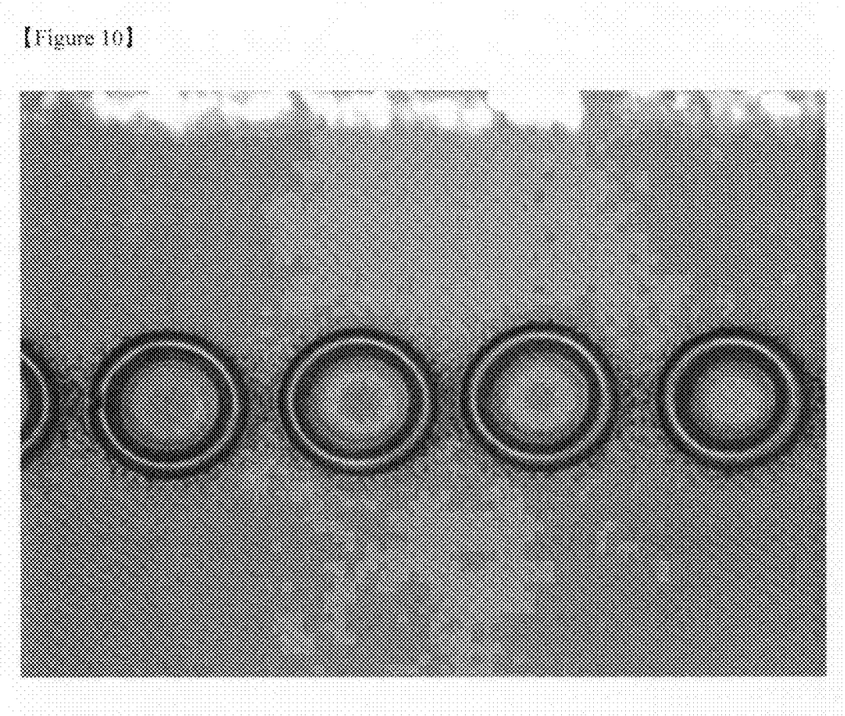
FIGS. 10 and 11 are diagrams showing fine line width patterns, drawn according to the conventional ink jet printing method.
Figure 11:
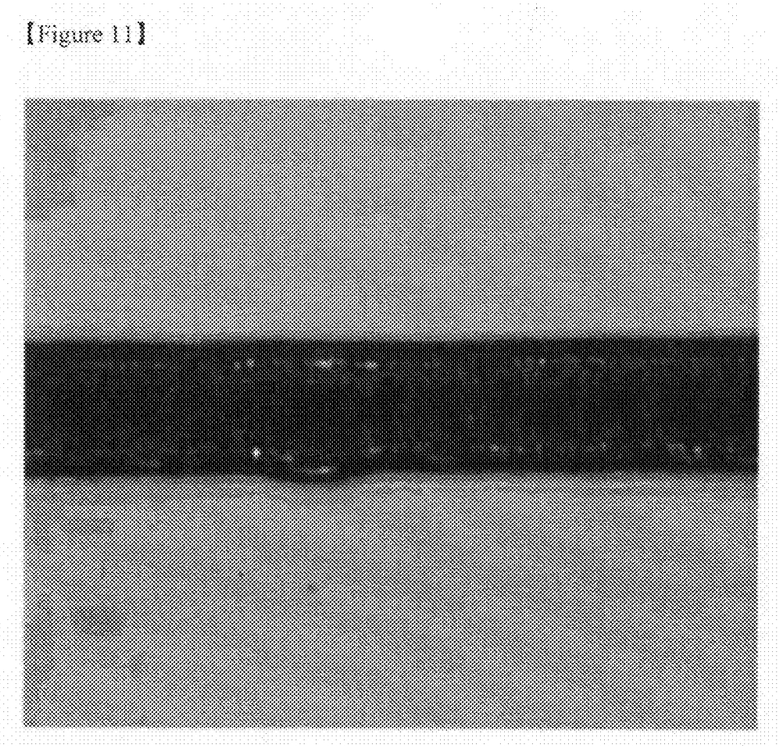

Then, a conventional conductive substrate is explained with reference to FIGS. 10 and 11. As shown in FIG. 10, when ink droplets successively discharged from the ink-jet head are hit to a region of a substrate where a fine line width pattern is formed, the ink droplets are flowed in an isotropic form due to a flat structure of the substrate. Accordingly, as shown in FIG. 11, it would be found that the ink droplets spread over the region of the fine line width pattern, thereby making the ink droplets more blurred.

As mentioned above, the high resolution ink-jet printing method using a pre-patterned substrate according to the present invention makes it possible to manufacture a conductive substrate having a fine line width pattern with high resolution regardless of characteristics of ink and substrate, in a way of forming a stripe pattern on a substrate and then allowing ink droplets to flow in an anisotropic form in a region where the stripe pattern such that a fine line width pattern may be formed.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

As described above, the present invention forms an anisotropic fine pattern on a surface of a substrate to which ink droplets are hit, thereby allowing the ink droplets hit to the surface of the substrate to flow in an anisotropic form within a fine line width along the anisotropic fine pattern due to the capillary phenomenon and thus preventing the ink droplets from being blurred.

Also, the present invention allows ink-jet printing with a fine line width of high resolution regardless of features of a substrate or kinds of ink.

In addition, the present invention allows manufacturing high quality high resolution display modules at lower cost in comparison to the conventional case, since complicated factors of substrate and ink may not taken into consideration.

The invention claimed is:

1. A method for high resolution ink-jet print using a pre-patterned substrate, which uses an ink-jet printing device including an ink-jet head for discharging conductive ink droplets and a driving stage for supporting a substrate to which the conductive ink droplets are hit, so as to draw a fine line width pattern on the substrate, the method comprising:
    (A) forming a stripe pattern with repeated stripes on a surface of a substrate on which a fine line width pattern is to be formed, thereby preparing a pre-patterned substrate;
    (B) loading the substrate to the ink-jet printing device; and
    (C) injecting conductive ink droplets to a region of the substrate where the stripe pattern is formed,
    wherein an equivalent interval (d) of the stripe pattern and a fine line width (D) of the drawn fine line width pattern satisfy a relation of d<<D, and the conductive ink droplets hit to the substrate are flowed in an anisotropic form within the region where the stripe pattern is formed.

2. The method for high resolution ink-jet print using a pre-patterned substrate according to claim 1, wherein the stripe pattern forming step (A) includes:
    (A1) forming an anti-reflective layer on the substrate;
    (A2) forming a photoresist layer on the anti-reflective layer;
    (A3) conducting a laser interference lithography process to the photoresist layer such that the photoresist layer has a photoresist pattern with repeated stripes, which periodically exposes the anti-reflective layer; and
    (A4) developing and etching the substrate on which the photoresist pattern is formed, thereby forming a stripe pattern on the substrate.

3. The method for high resolution ink-jet print using a pre-patterned substrate according to claim 1,
    wherein the stripe pattern has a positive or negative type.

4. The method for high resolution ink-jet print using a pre-patterned substrate according to claim 1,
    wherein the stripe pattern has a prominent and depressed shape having valleys and ridges.

5. The method for high resolution ink-jet print using a pre-patterned substrate according to claim 4,
    wherein the conductive ink droplets are flowed in an anisotropic form along the valleys, and the conductive ink droplets are not dispersed over the ridges.

6. The method for high resolution ink-jet print using a pre-patterned substrate according to claim 1,
    wherein the stripe pattern is formed using an imprinting or roll printing process.

7. The method for high resolution ink jet print using a pre-patterned substrate according to claim 2,
    wherein the stripe pattern has a positive or negative type.

8. The method for high resolution ink-jet print using a pre-patterned substrate according to claim 2,
    wherein the stripe pattern has a prominent and depressed shape having valleys and ridges.

9. The method for high resolution ink jet print using a pre-patterned substrate according to claim 8,
    wherein the conductive ink droplets are flowed in an anisotropic form along the valleys, and the conductive ink droplets are not dispersed over the ridges.

* * * * *